United States Patent
Andry et al.

(10) Patent No.: US 8,080,876 B2
(45) Date of Patent: Dec. 20, 2011

(54) STRUCTURE AND METHOD FOR CREATING RELIABLE DEEP VIA CONNECTIONS IN A SILICON CARRIER

(75) Inventors: Paul S. Andry, Yorktown Heights, NY (US); John U. Knickerbocker, Monroe, NY (US); Michelle L. Steen, Danbury, CT (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 831 days.

(21) Appl. No.: 12/147,466

(22) Filed: Jun. 26, 2008

(65) Prior Publication Data

US 2009/0039472 A1 Feb. 12, 2009

Related U.S. Application Data

(62) Division of application No. 11/669,924, filed on Jan. 31, 2007, now abandoned.

(51) Int. Cl.
*H01L 23/538* (2006.01)

(52) U.S. Cl. ......... 257/758; 257/E23.144; 257/E23.167; 438/667

(58) Field of Classification Search .................. 257/758, 257/E23.167, E23.144; 438/667
See application file for complete search history.

(56) References Cited

U.S. PATENT DOCUMENTS 6,919,638 B2 * 7/2005 Huang et al. .................. 257/758
2003/0205815 A1 * 11/2003 Chung .......................... 257/758

* cited by examiner

*Primary Examiner* — Benjamin Sandvik
*Assistant Examiner* — Krista Soderholm
(74) *Attorney, Agent, or Firm* — Daniel P. Morris; David Aker

(57) ABSTRACT

A process and structure for enabling the creation of reliable electrical through-via connections in a semiconductor substrate and a process for filling vias. Problems associated with under etch, over etch and flaring of deep Si RIE etched through-vias are mitigated, thereby vastly improving the integrity of the insulation and metallization layers used to convert the through-vias into highly conductive pathways across the Si wafer thickness. By using an insulating collar structure in the substrate in one case and by filling the via in accordance with the invention in another case, whole wafer yield of electrically conductive through vias is greatly enhanced.

9 Claims, 7 Drawing Sheets

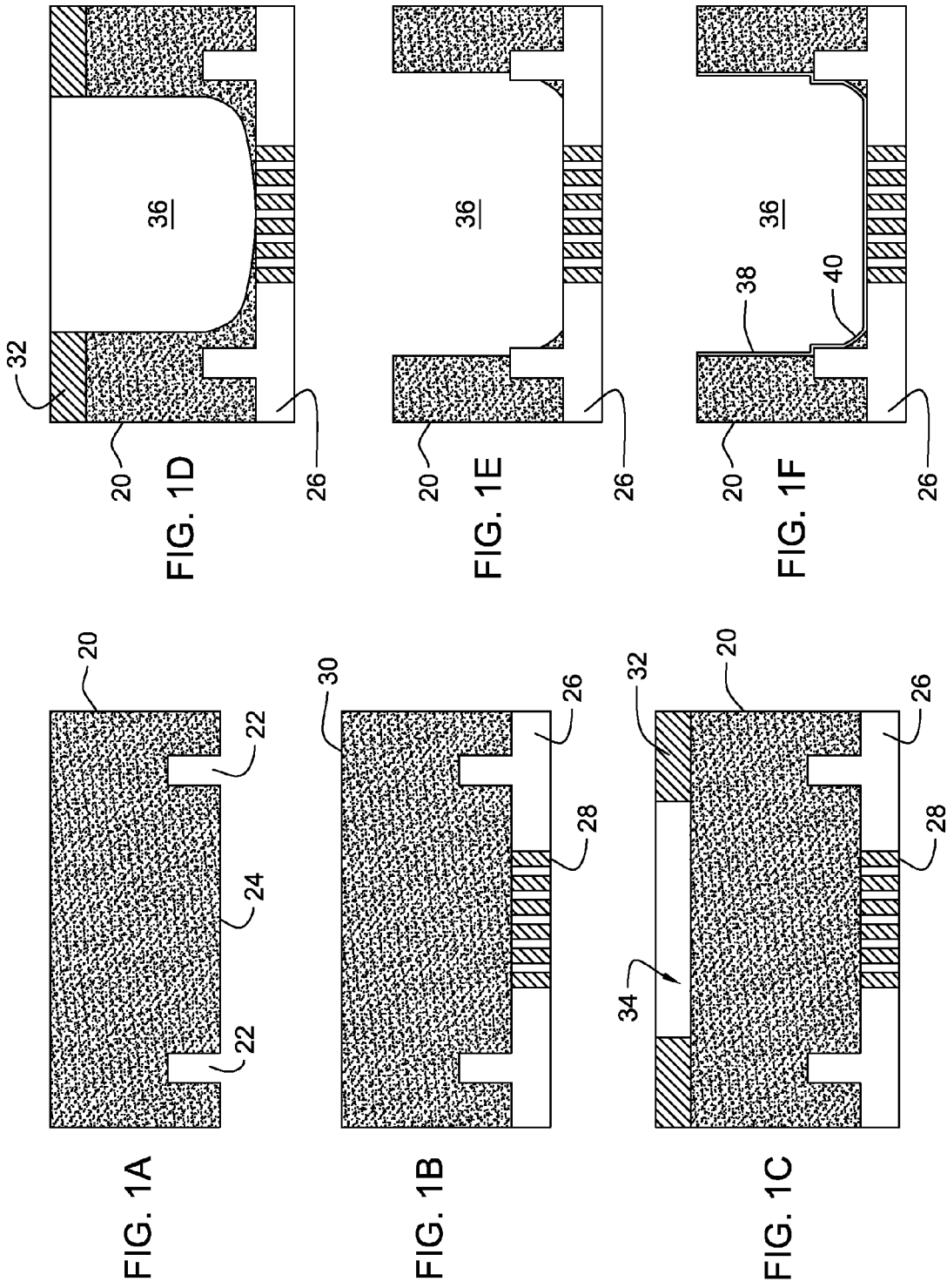

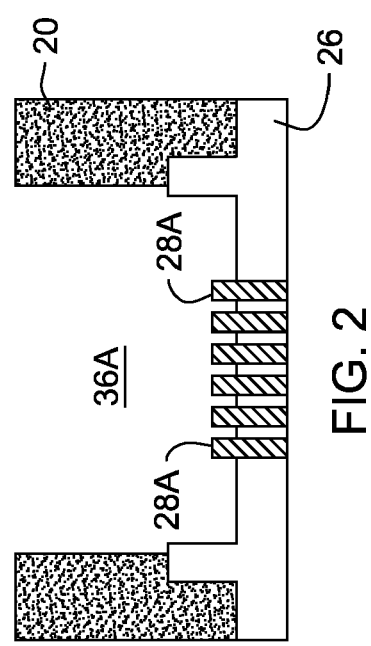

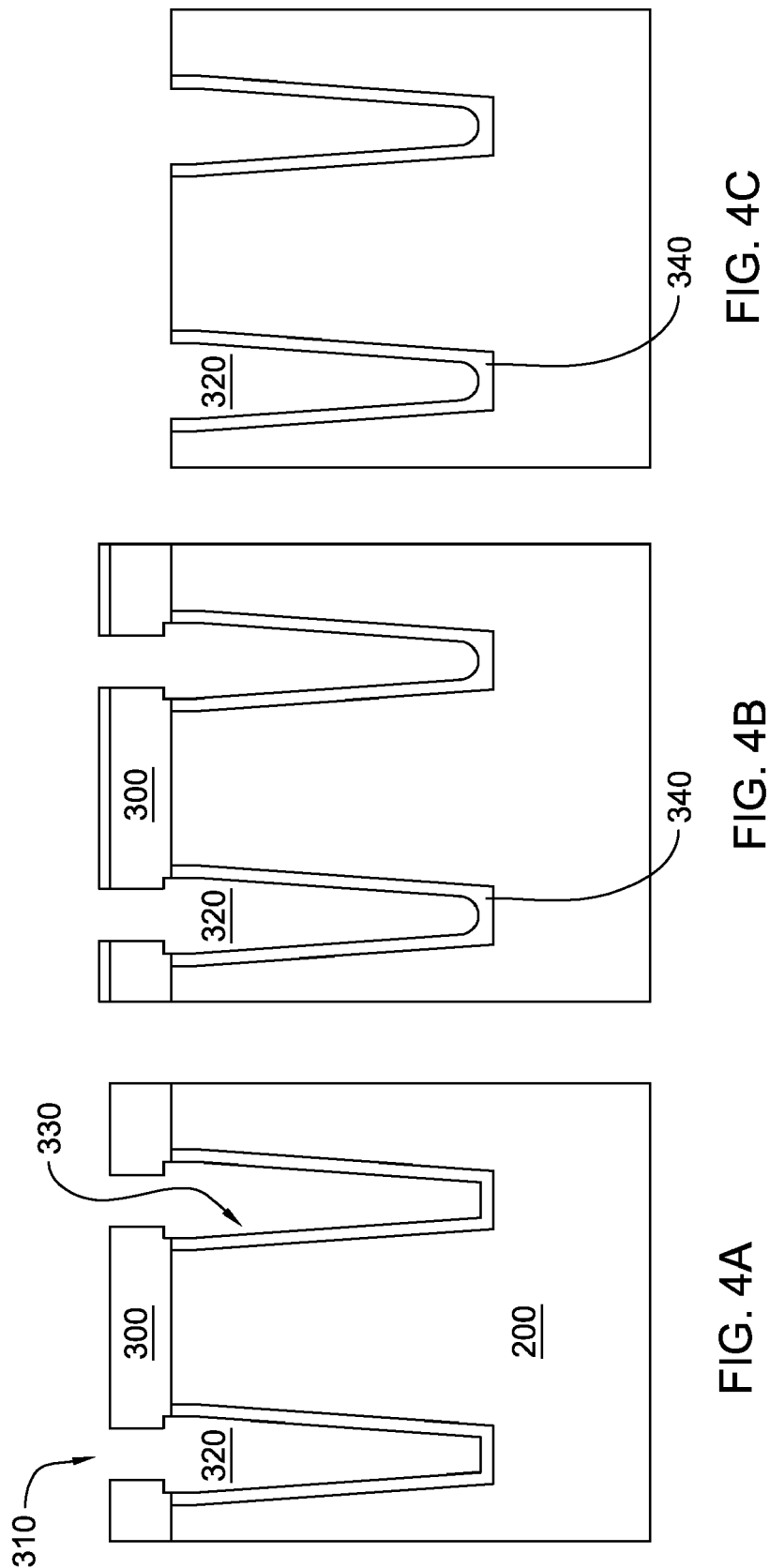

STRUCTURE AND METHOD FOR CREATING RELIABLE DEEP VIA CONNECTIONS IN A SILICON CARRIER

This application is a divisional of U.S. patent application Ser. No. 11/669,924 filed on Jan. 31, 2007 now abandoned, which is incorporated herein by reference, in its entirety.

This invention was made with Government support under Contract No. NBCH30390004 and Contract No. MDA972-03-3-004 awarded by the Defense Advanced Research Projects Agency. The Government has certain rights in the invention.

FIELD OF THE INVENTION

This invention is directed to processes and structures for enabling the creation of reliable electrical through-via connections in a semiconductor substrate. More particularly, it is directed to processes and structures which mitigate problems associated with under etch, over etch and flaring of deep Si RIE etched through-vias, thereby vastly improving the integrity of the insulation and metallization layers used to convert the through-vias into highly conductive pathways across the Si wafer thickness. This invention also relates to techniques for filling vias with an electrical conductor. Thus this invention greatly enhances whole wafer yield of electrically conductive through vias.

BACKGROUND OF THE INVENTION

There are many advantages to using silicon as a substrate for electronic packaging, rather than traditional ceramic and organic laminate packaging. Key features of the silicon carrier include: the ability to create high performance wiring and joining at much finer pitch than typical packaging, the ability to join heterogeneous technologies or different generation technologies for high speed applications, the ability to integrate passives, MEMs (micro electromechanical systems) or optical fibers, the ability to add silicon functionality to the carrier package in addition to wiring, the ability to dramatically increase the I/O density, and for many applications, the ability to reduce overall system cost when compared to other system on package (SOP) approaches which do not use Si as the carrier.

Elements and structures of semiconductor packages have been described in U.S. Pat. No. 5,998,292 to Black et al. and U.S. Pat. No. 6,593,644 to Chiu et al. The through-via structures described in these two cited works are constructed using a "vias first" process approach described below. In this method, deep blind vias (which may be up to several hundred micrometers in depth) are first etched into a silicon wafer, after which side wall insulation is deposited or thermally grown. The vias are then completely filled with a conductor, after which standard BEOL wiring levels are built on top of the silicon wafer. Up to this point in the process, the vias are still blind. They are converted to through-vias only when the whole wafer is thinned by backside grinding and/or etching to expose the via conductors on the backside. Once exposed, solder connections, such as C4 solder balls may then be built on the carrier back, and chips may be joined to the front, by any one of a number of conventional techniques, such as flip chip bonding.

The "vias first" process flow has the advantage that the side wall insulation process is fairly straightforward since a variety of techniques are available to ensure complete coverage of the side walls including, in many cases, thermal oxidation. Moreover, since the vias terminate in the silicon itself rather than on an etch stopping layer, there is little chance of side wall variation near the base of the via such as abrupt lateral etching or flaring. A smooth uniform side wall combined with thermal oxidation virtually assures high-yield via to via isolation.

On the other hand, in the "vias first" approach the filling of the through-vias must be absolutely complete, void-free and fully sealed at the top in order for wiring levels to be built on top and effectively connected down through the silicon wafer. Further, the conductive material used to fill the vias must be very well matched in coefficient of thermal expansion (CTE) to the silicon substrate otherwise mechanical deformation can take place during subsequent processing of the wiring levels leading to electrical and/or mechanical failure of the carrier by cracking of the silicon, the insulator or by upward pumping of material from within the via itself.

Another process approach is to build the devices and wiring according to the standard CMOS semiconductor process flow, adding the through-vias at the end of the process by driving them through from the back of the wafer. In this "vias last" approach the same techniques can be used to etch the vias e.g. deep anisotropic reactive ion etching (RIE) from an inductively coupled plasma source. However an important difference exists at the location of the via bottom. In the "vias first" process, the vias remains blind until the wafer is thinned to reveal the insulated conductors, at which time further processing must be done to add contact pads and insulate the back of the wafer. In the "vias last" approach the contact pads are built first on the front side of the wafer underneath the wiring levels, and are effectively uncovered at the back side by means of an etching process. This means that the contact pads, typically insulating layer of silicon oxide or silicon nitride perforated with conductive metal vias, act as etch stops.

This would be of little consequence in the case of perfect etch selectivity between the silicon and the etch stop, as well as perfect side wall passivation integrity at the contact pad to silicon interface. In practice, the etch chemistry available in deep Si RIE can be made very selective to common insulators and many metals used to create the contact pads. However, it is well known that side wall passivation in deep anisotropic etching has a tendency to become compromised at etch stop layers, which causes unintended lateral etching to begin at the foot of the via, resulting in reentrant features ranging from an outward flare to dramatic lateral undercutting. Since via insulation and metallization steps must take place after the via etching process, it is paramount that the via side wall be smooth from top to bottom and preferably vertical (slight positive slope is also acceptable) with no discontinuities or negatively flared regions which would make insulation and metal wall coating difficult or impossible.

Because all the wiring levels have already been built in the "vias last" process flow, the temperature cannot exceed a maximum of about 400 degrees C. which makes thermal oxidation impossible. Thus, low-temperature CVD or PECVD insulation with silicon oxide or nitride materials becomes a practical necessity in this case, and these do not coat reentrant via side walls (those having a negative slope or reverse taper) nearly as well as vertical walls, or walls having a slightly positive slope. Also, in the case where electroplating is to be used to coat the side walls with metallization, common liner and seed materials such as TaN, or metals such as Ta and Cu are typically sputtered into the vias, and once again smooth continuous surfaces without negative flare or undercut at the base are required to ensure complete coverage. A number of methods and structures have been described whereby through vias may be etched through silicon from the back in such a fashion as to land on a pad structure on the active side of the wafer. In U.S. Pat. No. 5,608,264 to S. J. Gaul a "vias first" process is described wherein vias begin as blind vias which are metal lined and completely filled with doped polysilicon, and are later exposed by etching the backside of the wafer. In one embodiment of this work, the polysilicon is later removed by wet KOH etching from the backside to create an open through via terminating on an oxide layer under a pad on the active front side. Such a structure avoids the problem of deep etch undercut at the pad interface since the via fill is entirely removed by highly selective wet etch. However, such a process is not a viable "vias last" process but instead is a time-consuming and potentially very expensive "vias first" process. Time and expense can be very high, especially when via diameter is large since the entire via must be first completely filled with CVD polysilicon in order to build the wiring levels, only to have all the polysilicon removed from the backside in a later etching step. As such, one of the most expensive and time consuming CVD steps turns out to be entirely sacrificial in this case.

U.S. Pat. No. 6,608,371 to Kuashima et al. discloses a true "vias last" process flow wherein the metal contact pads are first formed on the front side of a silicon wafer after which tapered through vias are formed using a laser. The vias are insulated, in the preferred embodiment, using a resin which could be made to fill the entire via, then opened again using a second laser etching step to produce a narrower diameter through hole coincident with the first. The via would then be metallized, where the metal could be applied in the form of a metal paste or solder. This method has a process flow which is more akin to board level packaging rather than silicon CMOS processing. In particular, the processing time and cost of using a laser system to create the through-vias grows in proportion to the number and density of vias required. For highperformance applications where several thousand through vias are required per die, and there are several hundred die per wafer, the raw processing time per wafer could be intolerably high. Further, the process so described specifies ranges for the through via diameter on a 50 μm thick wafer of 60 to 80 μm with the inner diameter of the insulated region ranging from about 30 μm to 40 μm. It is clear that vias of outer diameter of about 20 μm or less are difficult to produce or completely inaccessible to this method, whereas diameters down to 1 μm are feasible using deep anisotropic etching.

A CMOS-compatible "vias last" process having many steps generally comparable to the method described herein, but not having the novel steps and structure of the invention described below, can be found in U.S. Pat. No. 6,569,762 to Kong. In Kong the layer where the deep Si RIE etch lands is a blanket layer. For this reason, a second etch step with an oxide selective chemistry must be used to open this insulator and expose the contacts beneath. As has been well noted in the literature, it is extremely difficult in practice to maintain a vertical side wall at such an interface once all Si has been etched from the via. Recognizing the need for a smooth, continuous vertical side wall at the bottom of the via, U.S. Pat. No. 6,569,762 states explicitly that "maintaining the anisotropy of the etch and removal of any polymer material formed after the etch is important to the forming of holes from the back of the wafer to the front oxide. The etching of the holes is stopped at the front oxide by either a timed etch or by detecting a diminishing Si signal using an optical end point detector."

Simple timing and/or optical methods, while useful, simply cannot provide for a robust wafer scale process because center to edge variation in RIE etch rate is typically seen in all etch systems, which means that vias at different locations will always see a varying degree of over etch. Moreover, wafer thinning techniques such as backside grinding and spin etching are not perfectly uniform processes, especially when the wafers to be thinned are bonded to handling substrates other than Si wafers (e.g. borofloat glass) since these may have a total thickness variation on the order of 10 μm. The compounding effect of center to edge RIE etch variation and non-uniform starting thickness makes it practically impossible to etch each via to the same degree, and thus some attack of the side wall near the via bottom must be anticipated, when the vias are targeted to be fully etched during the first RIE etch step.

SUMMARY OF THE INVENTION

The present inventors have recognized that there is a need for structures and methods which enable high-yield, electrically robust through via connections to be built using CMOS-compatible silicon wafer processing tools. In particular, there is a need for highly manufacturable deep via etching processes with wide process windows.

It is therefore an aspect of the present invention to provide structures and methods for reliably creating deep silicon through-vias with smooth side wall surfaces free of discontinuities which would otherwise prevent uniform, high-yield insulation and metallization of the through-vias.

It is another aspect of the present invention to provide structures and methods for increasing the overall mechanical robustness and reliability of the electrical through via and contact pad assembly.

In accordance with one aspect, useful in a "vias last" process, the invention is directed to a method and structure for reliably landing deep RIE etched vias from one surface of a silicon wafer onto contact pad structures on the opposing surface comprises the steps of building a collar structure on the active side of a silicon wafer, the collar structure being filled with a material which acts as an etch stop to deep Si etch chemistry; building devices and wiring levels on the active side of the wafer; attachment of the wafer to a handler wafer to allow wafer thinning; patterning of the backside with the desired through via pattern taking care to align the via pattern such that it lands within the space defined by the collar on the opposite side; etching the via use deep silicon anisotropic etching, where vias may be slightly under etched or over etched; switching to a second etch chemistry, preferably a wet anisotropic (e.g. KOH, TMAH) or isotropic etch (e.g. HNO3+HF mixture) in order to complete the etch where needed, and to remove any sharp discontinuities from the base of the via by propagating the via side wall to or beyond the collar side wall.

It is another aspect of the invention, useful in a "vias first" process, to provide a method for filing the vias with an electrical conductor. In this respect, another aspect of the present invention provides a high aspect ratio, porous paste filled via, comprising: a semiconductor substrate having a high aspect ratio via defined therein, the via having a bottom and at least one side wall; a layer of an electrical insulator lining the via bottom and the at least one side wall, wherein the insulator electrically isolates the via from the substrate; a layer of an adhesion promoter lining the insulator; a layer of a seed material lining the adhesion promoter; a solid metal lining the via at few micrometer thickness; and porous paste filling the final space in the via.

An aspect of the present invention provides a high aspect ratio via having a depth of from about 100 to 300 micrometers and an aspect ratio of from about 3:1 to about 10:1.

An aspect of the present invention provides varied diameter vias properly tailored from edge to center so as to nullify the edge-to-center depth difference of the deep vias.

An aspect of the present invention provides a via within which the very bottom thickness of copper is increased to overcome the via depth difference across the wafer.

An aspect of the present invention provides a method to increase the bottom copper thickness in a preset manner thus overcoming the problem of via depth difference across the wafer.

An aspect of the present invention provides a method of fabricating a high aspect ratio deep via with controlled via bottom taper, which taper is controlled to give significantly thicker via bottom copper thickness.

An aspect of the present invention provides a method of fabricating a high aspect ratio deep via with flat bottom and tailored bottom copper thickness using contact or shadow mask to deposit the jet plasma copper into the deep via bottoms.

Thus, in general, these aspects of the invention may be directed to insulated, conductive through-vias formed in a carrier substrate that is thick enough to be self-supporting. Fabrication process practicalities place lower limits on via diameters. For realistic substrate thickness (e.g. 100-700 micrometers) and realistic via aspect ratios (e.g. 3:1 to 10:1), via diameters must range from about 10 micrometers to greater than 200 micrometers. Via fill methods common to integrated circuit interconnects become technically problematic or impractical when trying to fill such large blind holes (to be opened later). While there are techniques that overcome these practical issues by teaching a multitude of different methods to fill vias with metal-ceramic pastes, paste-filled vias are associated with an undesirably high degree of porosity. Extensive processing is required to seal any via surface containing exposed porosity as described. The present invention avoids these problems.

BRIEF DESCRIPTION OF THE DRAWINGS

The advantageous aspects and features of the present invention will become apparent upon further consideration of the following detailed description of the invention when read in conjunction with the drawing figures, which unless otherwise indicated are cross sectional views, and in which:

FIG. 1A illustrates a collar structure etched into a semiconductor substrate, such as a silicon wafer, in a "vias-last" process.

FIG. 1B illustrates a first insulation layer (into which conducting contact structures are built) deposited over the wafer of FIG. 1A, where the insulation has filled the etched collar structure.

FIG. 1C illustrates a via mask level patterned on the backside of the wafer shown in FIG. 1B.

FIG. 1D illustrates the via resulting from the mask pattern of FIG. 1C in the case where a typical deep Si anisotropic etch profile is used to expose the center region of the contact pad.

FIG. 1E illustrates the result of further etching the via of FIG. 1D, so that the diameter of the via increases to the point where it is at least coincident or wider than the diameter defined by the inner wall of the collar structure.

FIG. 1F illustrates the via of FIG. 1E after it has been fully lined with an insulator.

FIG. 2 illustrates an embodiment where the plane of conducting contacts extends beyond the etch stop insulation layer such the contacts are exposed before the insulation is completely removed.

FIGS. 4A, 4B and 4C are cross-sectional diagrams illustrating an example of a laminated, contact or shadow mask approach in increasing via bottom thickness selectively, in a "vias-first" process.

DESCRIPTION OF THE INVENTION

Figure 1G:
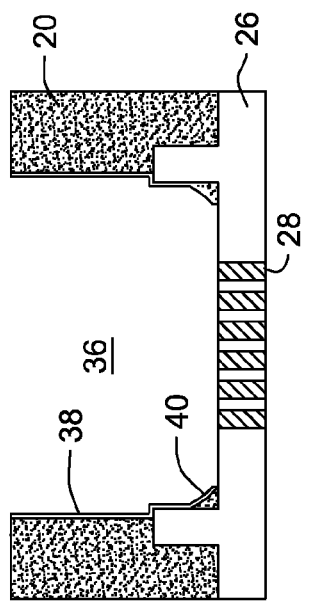
FIG. 1G illustrates the via of FIG. 1F after the insulation coating the floor of the via has been fully etched away exposing the conducting contacts below.

Referring to FIG. 1A, the present invention is directed to a structure and to a process for reliably building insulated through-vias in a silicon carrier or package, using a vias-last process. Beginning with a silicon wafer 20, the areas where the through-vias are to be positioned in the final carriers are first delineated by an etched annulus or moat structure 22 in the front surface 24 of the silicon wafer 20. Structure 22 may be a collar taking the shape of an annular circle, octagon or any number of other regular shapes. The depth of this feature may practically range from about one microns to tens of microns, and its width may range from less than a micron to many microns.

Referring to FIG. 1B, the moat structure 22 is then filled with an insulating etch stop material or layer 26 such as silicon dioxide, silicon nitride or a polymeric insulator such as polyimide after which the entire wafer is insulated in preparation for the construction of metal wiring levels. Electrically conducting contacts 28 are built which perforate the insulating layer 26 at a position within the region defined by the moat structure 22, near the center of the contact pad, centered on the area where the via will be etched in from the backside 30 as shown in FIG. 1B. One or more wiring levels may subsequently be built on the front surface of the silicon substrate to enable it to serve as an interconnection package for multiple Si die. Once the desired front side processing has been completed the wafer may be attached to a handling wafer (not shown) such that back side wafer thinning may be performed by a combination of grinding and polishing, or chemical etching.

Multiple conducting contacts 28 are used to increase reliability and to decrease total resistance, if a single connection is to be made. In other cases, the conducting contacts 28 may act as conductors to various parts of a circuit, such as for the distribution of a signal, or for the distribution of power to the wiring levels built on the front surface of the silicon substrate.

Referring to FIG. 1C, once the desired wafer thickness has been achieved, the back side 30 of the wafer is patterned with a patterning layer 32 having opening therein 34, such that the through-via openings are aligned and centered within the region defined by the front side moats 22, and such that the back side via pattern diameter is less than the inner diameter of the front side insulated moat structure 22. Thus, the via opening will be smaller in lateral dimension than the opening defined on the front surface by the inner walls of the etched collar.

Referring to FIG. 1D, anisotropic deep silicon etching may be performed to form the through-via openings 36. In FIG. 1D the opening 36 has not fully propagated to the edges of the contact pad where the electrical conductors 28 are located, i.e. the via is only partially formed. Because of RIE lag effects and natural center-to-edge variation in most etch tools, it is practically impossible to etch each of the vias at precisely the same rate across the entire silicon wafer. Despite best efforts, one may well end up with a situation where the vias in one region are slightly under etched as shown in FIG. 1D, whereas those in another are over etched and, as a result, flared at the bottom as shown in FIG. 1H. The present invention allows for robust insulated vias to be obtained in both cases.

As illustrated in FIG. 1E, beginning with the under etched case shown in FIG. 1D, the wafer 20 may be further etched, preferably by subjecting the wafer 20 to a second etch which is highly selective to silicon over the insulating or metal contact materials, and which does not lead to the same undercut problem seen with deep silicon RIE. As a result of this further etching, any remaining un-etched Si at the foot of the via is effectively disconnected from the bulk wafer by the insulating collar wall. Several wet etches exist which are well suited to the task. Anisotropic etches such as potassium hydroxide (KOH) and tetramethyl ammonium hydroxide (TMAH) will etch the <111> planes more rapidly than the <100> planes of Si thus converting an initially round via into a partially octagonal via when viewed from above. As long as the collar shape of the moat 22 is properly designed to take this into account, then anisotropic wet etching may be used, and will initially lead to the residual Si angles shown at the base of the vias in FIG. 1E and in FIG. 1I. Alternatively, an isotropic etch such as a mixture of $HNO_3+HF$ can be used to etch the residual Si at the base of the via while expanding the diameter of the via, as in FIG. 1I. In both cases it is desirable for the diameter of the via to expand beyond the inner wall of the insulated collar or moat structure 22 to ensure ease of side wall insulation coverage by an insulating layer 38, and enable effective side wall anisotropic etching of the insulator over the contacts while preserving it on the side walls. Insulating layer 38 is preferably silicon oxide or silicon nitride deposited by plasma-enhanced chemical vapor deposition (PECVD).

Figure 1H:
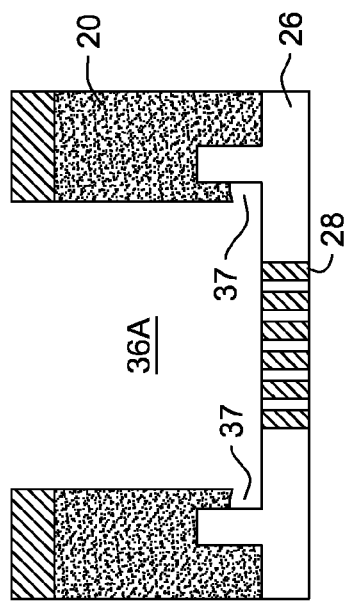
FIG. 1H illustrates the via resulting from the mask pattern of FIG. 1C in the case where a typical deep Si anisotropic etch profile is used to fully expose the entire contact pad such that an over etch profile is obtained.

In the case illustrated in FIG. 1G, there is no danger of metal shorting to residual Si 40 left at the base of the via close to the side wall as long as the residual Si is fully contained by the moat 22, i.e. the residual Si is completed disconnected from the bulk of the wafer 20, as described above with respect to FIG. 1E. In FIG. 1H the via 36A is undercut at the bottom at 37. The limit of the undercutting is contained by the portion of etch stop material or layer 26 extending into the collar or moat structure 22. Etching may continue, as illustrated in FIG. 1I.

Figure 1I:
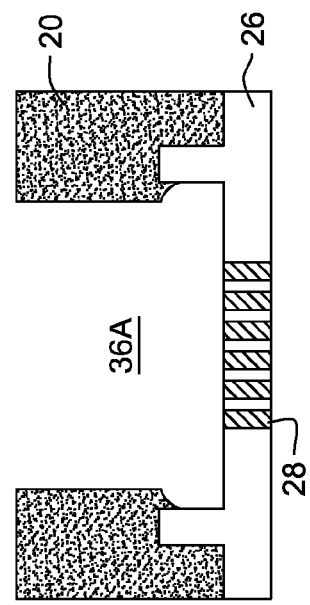
FIG. 1I illustrates the result of further etching the via of FIG. 1H so that the diameter of the via is increased, and the shape of the undercut has begun to propagate up the wall of the collar structure.
Figure 1J:
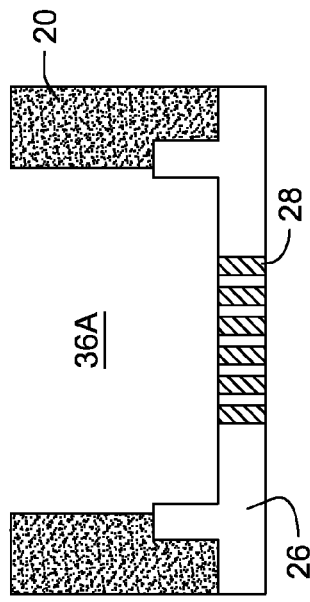
FIG. 1J illustrates the result of further etching the via of FIG. 1I using the second etch process such that the diameter of the via increases to the point where it is at least coincident or wider than the diameter defined by the inner wall of the collar structure.
Figure 1K:
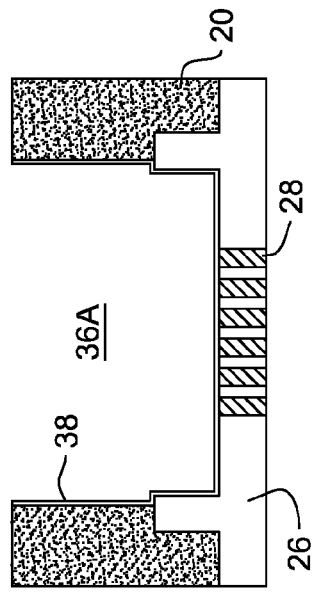
FIG. 1K illustrates the via of FIG. 1J after it has been fully lined with an insulator.

FIG. 1J illustrates the result of further etching the via of FIG. 1I using the second etch process such that the diameter of the via increases to the point where it is at least coincident or wider than the diameter defined by the inner wall of the collar structure of etch stop material or layer 26. FIG. 1K illustrates the application of an insulating layer 38.

Figure 1L:
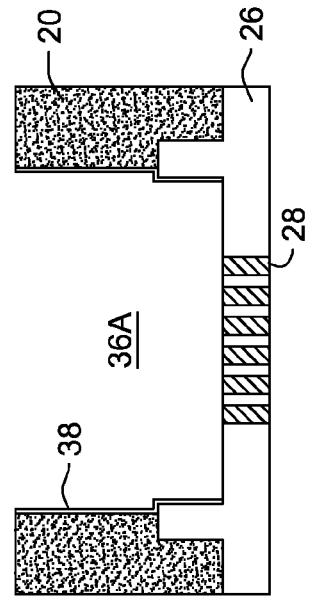
FIG. 1L illustrates the via of FIG. 1K after the insulation coating the floor of the via has been fully etched away exposing the conducting contacts below.

FIG. 1L illustrates the via of FIG. 1K after the insulation coating the floor of the via has been fully etched away exposing the conducting contacts below. Once the side wall insulated vias shown in FIG. 1G and/or FIG. 1L are obtained, any convenient metallization scheme may be used to create the conductive filling of the through-via including, but not limited to, CVD metal, sputtering, electroplating, filling with molten metal or conductive paste. The via may be left only partially filled with conductor as with a plated through hole (PTH) structure in standard FR4 board technology.

Referring to the embodiment of FIG. 2, the electrical contacts 28A perforating the front side pad extend beyond a plane of the insulated pad region, into the region where conductive material is deposited. Thus, intimate electrical contact is made between the electrical contacts 28A, and the conductive material of the via.

Thus, it has been shown that the structure of the via itself and the processes used to create the via differ in substantive respects from the prior art, and that these differences are extremely significant in increasing production yield. A significant departure from the prior art is in the etch stop oxide layer. In the method described herein this step in unnecessary since the contacts are exposed at the same time, or even before the field oxide. However, the etch collar structure surrounding the via where it lands on the oxide of the active layer provides a major advantage over prior art structures.

Figure 3:
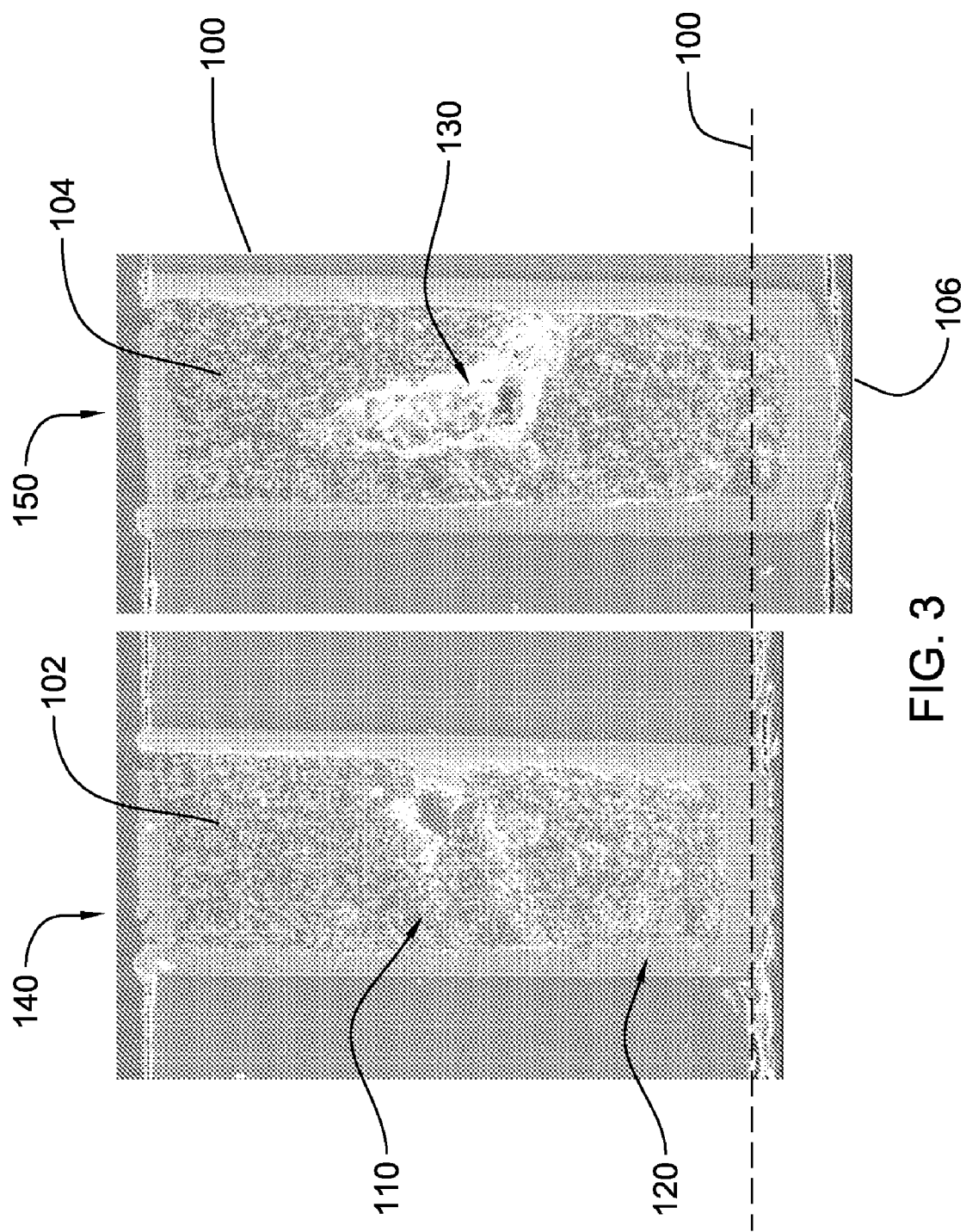
FIG. 3 illustrates a via depth difference effect of the prior art.

FIG. 3 is a description of the problem that an aspect of the present invention overcomes, in a "vias-first" process. It has been shown that deep via depth may vary from the edge of the wafer 100 to the center of the wafer up to few tens of micrometers. The vias 102 and 104 shown in FIG. 3 are lined with copper 120 and filled with paste 110. The paste 110 has about 50% porosity above which macroscopic porosity 130 due to blind via fill limitations based on fundamental principles is observed. As described above, in order to create a through-carrier connection, the backside 106 of the wafer, which may be formed of silicon or glass, or other insulating material, is ground and polished to expose along 100 each and every copper-lined via in the wafer. In order to expose each and every via in the whole wafer with high yield, some vias will have the porous paste exposed 150 after the completion of the process. When the porous fill is exposed on the backside, processing solutions ingress into the vias, which may result in later reliability problems due to presence of ionics in the form of salts, for example. It is therefore necessary to alter the processing to allow freedom in backside grinding and polishing to result in robust, reliable through-vias with high yield across the entire wafer.

One obvious option would be to deposit a thicker copper liner in the vias. However, the volume of copper needs to be controlled so as to avoid thermal expansion coefficient mismatch caused problems during high temperature processing, such as copper pumping. For electrical purposes, few micrometer thick copper is all that is needed, which thinner copper would keep the deposition time under control, reducing processing turn-around-time and thus cost.

To solve the problem discussed above, the novel filling technique described below may be utilized.

This invention is directed to insulated, conductive through-vias formed in a self-supporting carrier substrate. The requirement that the substrate be self-supporting implies a thickness of from about 100 to 700 micrometers. The vias are formed as blind vias.

However, it is intended that they be opened to form through-vias. For purposes of the present invention, via cavities may be formed by any of a variety of methods known to the art.

Fabrication process practicalities place lower limits on via diameters. Given realistic substrate thicknesses of up to 700 micrometers and realistic via aspect ratios (e.g. 3:1 to 10:1), via diameters must range from about 10 micrometers to greater than 200 micrometers.

In view of the problems associated with the deep via depth uniformity across the wafer this aspect of the invention relates to increases in via diameter of about 1 micrometer for every 2 micrometer depth correction required across the entire wafer. Thus when via diameter goal is 70 micrometers, even with 20 micrometer via depth non-uniformity from center to edge of the wafer, the diameter variance center to edge would be about 10 micrometers or about 15%, using the this aspect of the invention. The values given here are intended only as examples. The correct tailoring of via mask is dependent on via etch method and tooling used.

Referring to FIG. 4A, FIG. 4B and FIG. 4C, another aspect of the present invention provides a method of fabricating a high aspect ratio deep via with straight side walls and increased thickness of via bottom copper using laminated Riston (or another such organic) coating 300 on the surface of a wafer 200 with diffusion barrier (not shown) and copper lined 330 deep vias 320. The pattern 310 in the laminated film is aligned with the deep vias 320 and via diameter 310 in the mask 300 used may be slightly reduced as compared to the actual bottom dimension of deep via 320. A few micrometers of copper are then deposited at the via bottom using a line-of-sight jet plasma deposition technique. Since the jet plasma deposition temperature can be kept low, the organic lift-off mask will not be degraded and the excess material can be conveniently lifted off as known in the art.

Another aspect of the present invention provides a method of fabricating a high aspect ratio deep via with straight side walls and thick bottom copper film using laminated Riston (or another such organic) coating 300 on the surface of the wafer 200 with the metal lined 330 deep vias 320. The pattern is aligned with the deep vias and via diameter in the mask used may be slightly reduced as compared to the actual deep via dimension. Added copper is then deposited at via bottom using a line-of-sight jet plasma deposition technique with a preprogrammed pattern of deposition allowing tailoring of the required bottom copper thickness from sub-micrometer thickness to few micrometer thickness.

Figure 5B:
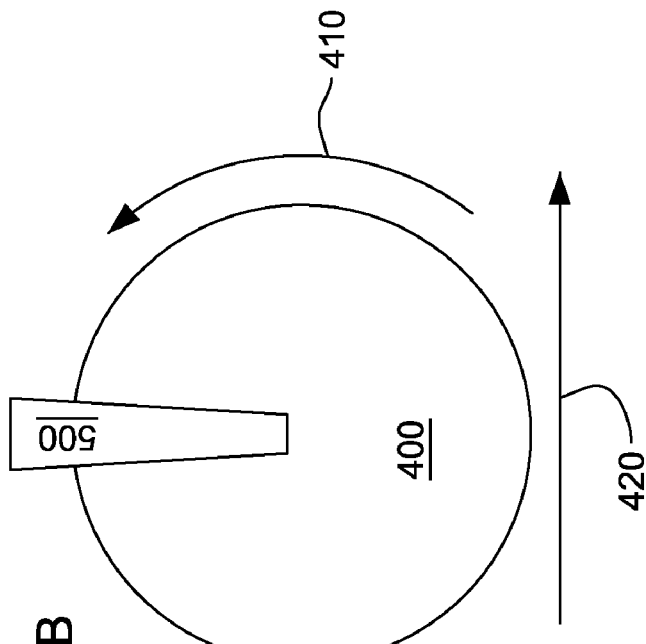
FIG. 5A and FIG. 5B illustrate two examples of relative motion of a wafer and a jet plasma nozzle.
Figure 5A:
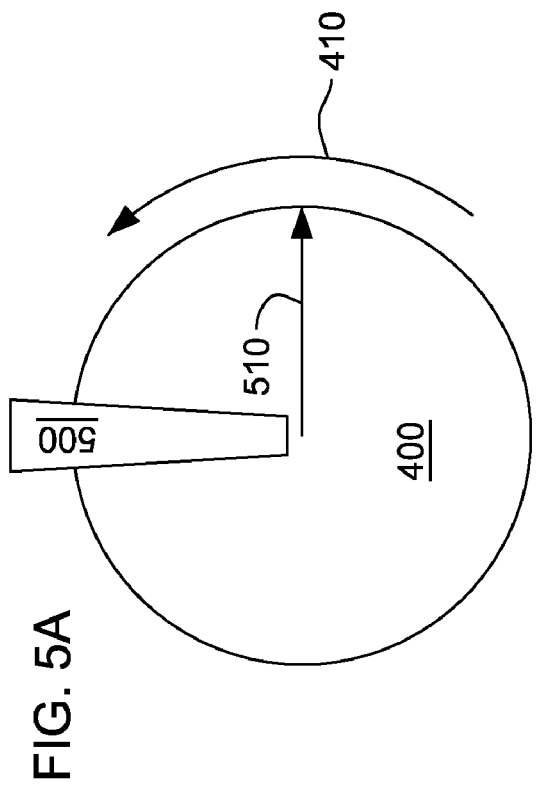

Referring to FIG. 5A and FIG. 5B, the thickness difference is achieved by via wafer movement or jet source movement speed during deposition as a function of distance from the wafer center. Specifically, FIG. 5A shows an option where the jet plasma nozzle 500 is moved 510 across the diameter of the wafer 400 at a predetermined rate while the wafer is rotated 410 at another predetermined rate so as to compensate for the deep via thickness differences across the wafer. FIG. 5B shows another option where the jet plasma nozzle 500 is stationary while the wafer 400 is rotated 410 and moved 420 beneath the jet plasma nozzle 500 at predetermined rates to achieve required deep via bottom copper thickness.

It is clear that the two options shown in FIGS. 5A and 5B are not the only relative movement patterns that may be programmed and by no means limits the options to these two only. Any difference in the measured via depth can then be compensated with the programmed jet plasma deposition of metal at the via bottom.

Yet another aspect of the present invention provides a method to tailor the taper of the deep via 260 as is known in the art in such a manner that when a certain thickness of copper is deposited onto the side walls of the via, the bottom thickness of the copper is adequate to compensate for the via depth difference across the wafer.

Figure 6C:
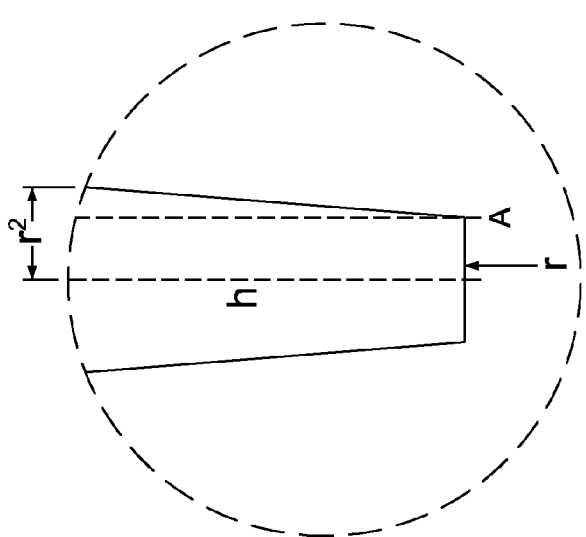
FIG. 6C is a schematic diagram of the bottom of a via as illustrated in FIG. 6B.
Figure 6B:
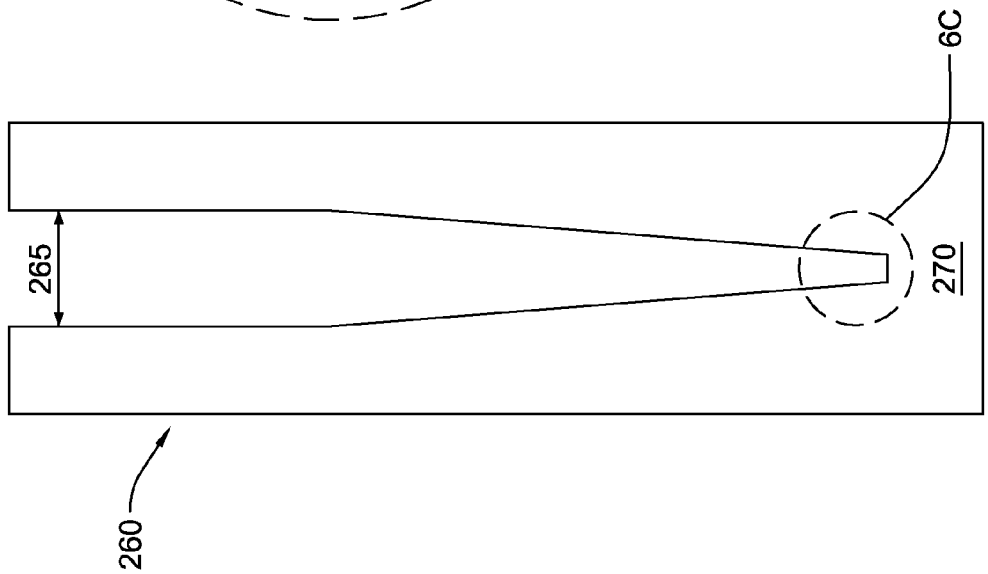
FIG. 6B is a geometric diagram illustrating the manner in which bottom diameter of the via of FIG. 6A may be controlled.
Figure 6A:
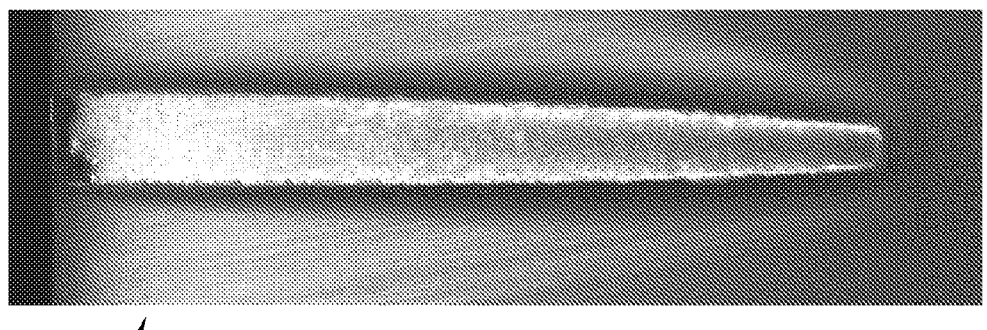
FIG. 6A shows an example of a tapered via.

FIG. 6B shows how a via may be tapered so as to result in a tailored via bottom diameter such that a few micrometer thick copper via side wall coating will result in solid copper thickness of several micrometers at the bottom of the via. The via shape shown in FIG. 6B by no means indicates the only possible type, but shows a generalized feature.

As an example, using the schematic shown in FIG. 6C, and assigning the variables as follows:
h=solid copper height (μm)
r2=via side wall copper thickness (μm)
r=via bottom radius (μm)
A=taper angle, which can be calculated:

$$\tan A = (r2-r)/h$$

Results of this experiment are shown in Table 1.

TABLE 1

| h (μm) | r2 | r (μm) | via bottom region taper | 300 μm deep via top radius, taper constant |
|---|---|---|---|---|
| 10 | 5 | 1 | 21.8 | 121 |
| 10 | 5 | 2 | 16.7 | 92 |
| 10 | 5 | 3 | 11.3 | 63 |
| 10 | 5 | 4 | 5.7 | 34 |

Table 1 shows that if the taper is designed to be approximately 5.7 degrees the top via radius will be about 34 micrometer. If higher taper is preferred at the bottom of the via, then taper will be tailored to vary from top to bottom so as to result in required via diameter at the top and at the bottom of the via, which dimensions are guided by the required copper thickness at the via bottom to compensate any via depth differences experienced due to deep via RIE process.

Thus, the advantageous via filling method in accordance with the invention secures the integrity of the deep via without exposure of the paste porosity during the wafer thinning and polishing that exposes the conducting bottom of the deep via.

Variations described for the present invention may be realized in any combination desirable for each particular application. Thus particular limitations, and/or embodiment enhancements described herein, which may have particular advantages to the particular application need not be used for all applications. It will be clear to those skilled in the art that other modifications to the disclosed embodiments can be effected without departing from the spirit and scope of the invention. Thus, it should be understood that the embodiments have been provided as an example and not as a limitation. The scope of the invention is defined by the appended claims.

Having thus described our invention, what we claim as new and desire to secure by Letters Patent is as follows:

1. An insulated through via structure formed in a substrate, comprising:
    an insulated pad region perforated with metal contacts formed in said substrate;
    an annular structure formed in said substrate so as to surround the insulated pad region, said annular structure formed to a depth into the substrate which is greater than that of a plane defined by the insulated pad region;

a backside through-via centered on, and contained entirely within, lateral dimensions of the annular structure, and opened to expose a front side metal contact; and an insulating layer completely covering side walls of the through-via, but not covering the metal contacts formed in said substrate.

2. The structure as recited in claim 1, wherein the insulating pad is formed of a material selected from the group consisting of silicon dioxide, silicon nitride and a polyimide.

3. The structure as recited in claim 1, wherein the material filling the annular structure is selected from the group consisting of silicon dioxide, silicon nitride or polyimide.

4. The structure as recited in claim 1, wherein the annular structure is integral with the insulated pad region.

5. The structure as recited in claim 1, where the via side wall insulation is formed of silicon dioxide or silicon nitride.

6. The structure as recited in claim 1, where the contacts perforating the front side pad extend beyond a plane of the insulated pad region.

7. The structure as recited in claim 1, further comprising an inner layer of metal deposited into the through-via such that it is in contact with the insulating side walls as well as said contacts, at the base of the via.

8. The structure as recited in claim 7, where the metal is selected from the group consisting of Ti, Ta, W, TiW, Cr, Mo, Ni, Al or Cu.

9. A method for forming an insulated through via structure in a substrate, comprising:

forming an insulated pad region perforated with at least one metal contact on said substrate;

forming an annular structure in said substrate so as to surround said insulated pad region, said annular structure formed to a depth into the substrate which is greater than that of a plane defined by the insulated pad region;

forming a backside through-via centered on, and contained entirely within, lateral dimensions of the annular structure, so as to expose said at least one metal contact; and forming an insulating layer completely covering side walls of the through-via, but not covering the metal contacts formed in said substrate.

* * * * *